(12) United States Patent
Scott et al.

(10) Patent No.: US 10,263,616 B1
(45) Date of Patent: Apr. 16, 2019

(54) RADIO FREQUENCY SWITCH

(71) Applicant: Qorvo US, Inc., Greensboro, NC (US)

(72) Inventors: Baker Scott, San Jose, CA (US);
George Maxim, Saratoga, CA (US);
Dirk Robert Walter Leipold, San Jose, CA (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 15/939,625

(22) Filed: Mar. 29, 2018

(51) Int. Cl.
*H03K 17/687* (2006.01)
*H04B 1/40* (2015.01)

(52) U.S. Cl.
CPC ........... *H03K 17/687* (2013.01); *H04B 1/40* (2013.01)

(58) Field of Classification Search
None
See application file for complete search history.

(56) References Cited

U.S. PATENT DOCUMENTS

| | | | |
|---|---|---|---|
| 5,661,414 A | 8/1997 | Shigehara et al. | |
| 5,689,144 A | 11/1997 | Williams | |
| 5,880,620 A | 3/1999 | Gitlin et al. | |
| 5,973,364 A | 10/1999 | Kawanaka | |
| 6,191,615 B1* | 2/2001 | Koga | H03K 19/0013 326/81 |
| 8,729,948 B2* | 5/2014 | Sugiura | H03K 17/693 327/308 |
| 9,013,225 B2 | 4/2015 | Madan et al. | |
| 9,048,836 B2* | 6/2015 | Maxim | H03K 17/302 |
| 9,628,075 B2 | 4/2017 | Cebi et al. | |
| 10,044,349 B2* | 8/2018 | Scott | H03K 17/04123 |
| 2002/0057139 A1 | 5/2002 | Matsumura et al. | |
| 2002/0079544 A1 | 6/2002 | Shino | |
| 2003/0085777 A1 | 5/2003 | Kim et al. | |
| 2005/0195063 A1 | 9/2005 | Mattsson | |

(Continued)

FOREIGN PATENT DOCUMENTS

| | | |
|---|---|---|
| EP | 1184977 A2 | 3/2002 |
| WO | 2005117255 A1 | 12/2005 |

OTHER PUBLICATIONS

Hoppenjans, Eric E. et al., "A Vertically Integrated Tunable UHF Filter," International Microwave Symposium Digest (MTT), May 23-28, 2010, Anaheim, California, IEEE, pp. 1380-1383.

(Continued)

*Primary Examiner* — Jeffery S Zweizig
(74) *Attorney, Agent, or Firm* — Withrow & Terranova, P.L.L.C.

(57) ABSTRACT

A radio frequency switch having a first node, a second node, and a plurality of switch cells that are coupled in series between the first node and the second node is disclosed. Each of the plurality of switch cells is made up of a main field-effect transistor (FET) having a main drain terminal, a main source terminal, a main gate terminal, and a main body terminal. Further included is a first body bias FET having a first drain terminal coupled to the main gate terminal, a first gate terminal coupled to the main drain terminal, a first body terminal coupled to the main body terminal, and a first source terminal, and a second body bias FET having a second drain terminal coupled to the main gate terminal, a second body terminal coupled to the main body terminal, and a second source terminal coupled to the first source terminal.

20 Claims, 3 Drawing Sheets

(56) References Cited

U.S. PATENT DOCUMENTS

| | | |
|---|---|---|
| 2006/0220727 A1 | 10/2006 | Yen |
| 2007/0018247 A1 | 1/2007 | Brindle et al. |
| 2008/0237677 A1 | 10/2008 | Futatsugi |
| 2011/0163824 A1 | 7/2011 | Kawano |
| 2012/0081192 A1 | 4/2012 | Hanaoka |
| 2012/0146149 A1 | 6/2012 | Momiyama |
| 2013/0299890 A1 | 11/2013 | Oh et al. |
| 2015/0035582 A1 | 2/2015 | Maxim et al. |
| 2015/0155278 A1 | 6/2015 | Seo et al. |
| 2015/0341026 A1 | 11/2015 | de Jongh |

OTHER PUBLICATIONS

Joshi, H. et al., "Tunable high Q narrow-band triplexer," IEEE MTT-S International Microwave Symposium Digest, Jun. 7-12, 2009, Boston, MA, IEEE, pp. 1477-1480.

Kamali-Sarvestani, Reza et al., "Fabrication of High Quality Factor RF-Resonator Using Embedded Inductor and Via Capacitor," IECON 2010—36th Annual Conference on IEEE Industrial Electronics Society, Nov. 7-10, 2010, Glendale, Arizona, IEEE, pp. 2283-2287.

International Search Report and Written Opinion for PCT/US2014/030431, dated Jun. 20, 2014, 14 pages.

Non-Final Office Action for U.S. Appl. No. 14/449,594, dated Oct. 10, 2014, 8 pages.

Notice of Allowance for U.S. Appl. No. 14/449,594, dated Feb. 4, 2015, 6 pages.

Ex Parte Quayle Action for U.S. Appl. No. 15/494,605, dated Jun. 1, 2018, 5 pages.

U.S. Appl. No. 15/494,605, filed Apr. 24, 2017.

U.S. Appl. No. 15/907,631, filed Feb. 28, 2018.

Ex Parte Quayle Action for U.S. Appl. No. 15/494,605, mailed Jun. 15, 2018, 5 pages.

Notice of Allowance and Examiner-Initiated Interview Summary for U.S. Appl. No. 15/494,605, dated Sep. 10, 2018, 9 pages.

Non-Final Office Action for U.S. Appl. No. 15/907,631, dated Oct. 22, 2018, 8 pages.

Notice of Allowance for U.S. Appl. No. 15/907,631, dated Dec. 13, 2018, 8 pages.

\* cited by examiner

RADIO FREQUENCY SWITCH

RELATED APPLICATIONS

This application is related to U.S. patent application Ser. No. 15/907,631, filed Feb. 28, 2018, and titled RADIO FREQUENCY SWITCH, the disclosure of which is hereby incorporated herein by reference in its entirety. This application is also related to U.S. patent application Ser. No. 15/494,605, filed Apr. 24, 2017, now U.S. Pat. No. 10,181,478, and titled RADIO FREQUENCY SWITCH HAVING FIELD EFFECT TRANSISTOR CELLS, which claims priority to U.S. provisional application Ser. No. 62/443,047, filed Jan. 6, 2017, the disclosures of which are hereby incorporated herein by reference in their entireties.

FIELD OF THE DISCLOSURE

Embodiments of the present disclosure relate to radio frequency switching circuitry.

BACKGROUND

An important electronic component of a radio frequency (RF) transceiver is a field-effect transistor (FET) that makes up stacked FET-type RF switches. An RF switch that is FET based typically needs linearity compensation to prevent generation of harmonic distortion when transmit signals are applied to the RF switch while the RF switch is in an off-state. The RF switch is effectively open while in the off-state, and the transmit signals are prevented from passing through the RF switch. However, while the RF switch is open, undesirable harmonics are generated from the transmit signals in part due to non-linear capacitance inherent to the RF switch. The undesirable harmonics pass from the RF switch and interfere with the RF transceiver's receiver circuitry.

A traditional off-state linearization network is placed in parallel with the RF switch to reduce the undesirable harmonics. While the traditional off-state linearization network does reduce the harmonic distortion when transmit signals are applied to the RF switch in the off-state, the traditional off-state linearization network takes up valuable circuit real estate because it requires external bias circuitry. What is needed is to regain valuable real estate are off-state linearization networks that do not require external bias circuitry.

SUMMARY

A radio frequency switch having a first node, a second node, and a plurality of switch cells that are coupled in series between the first node and the second node is disclosed. Each of the plurality of switch cells is made up of a main field-effect transistor (FET) having a main drain terminal, a main source terminal, a main gate terminal, and a main body terminal. Further included is a first body bias FET having a first drain terminal coupled to the main gate terminal, a first gate terminal coupled to the main drain terminal, a first body terminal coupled to the main body terminal, and a first source terminal, and a second body bias FET having a second drain terminal coupled to the main gate terminal, a second body terminal coupled to the main body terminal, and a second source terminal coupled to the first source terminal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
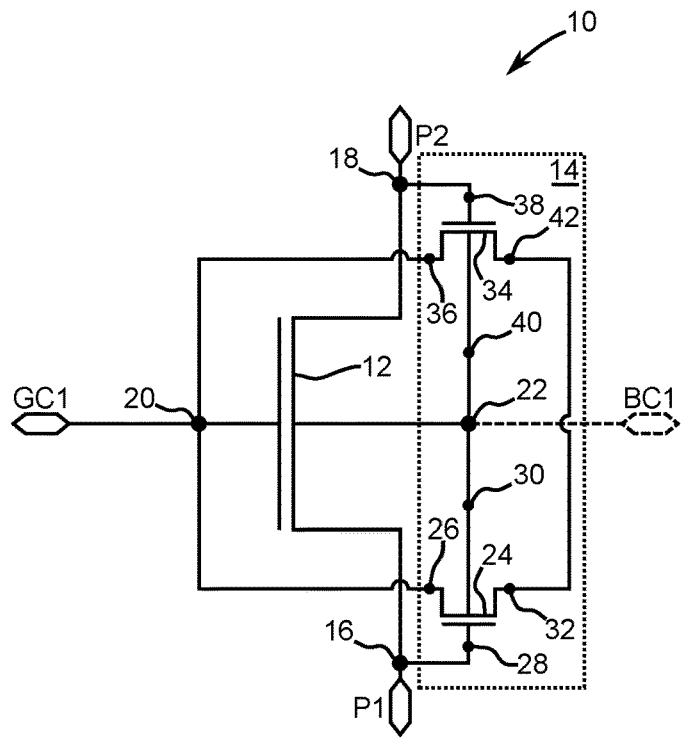
FIG. 1 is a schematic of a first embodiment of a radio frequency switch cell having an off-state linearization network in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Radio frequency switches have field-effect transistors that couple together in a series stack from drain to source. Each of the field-effect transistors has drain-to-body and drain-to-source nonlinear capacitances that cause harmonic distortions to be generated while radio signal voltages are applied to the radio frequency switches when the radio frequency switches are in an off-state. Off-state linearization networks are coupled to the radio frequency switches to compensate for the drain-to-body and drain-to-source nonlinear capacitances. In particular, traditional off-state linearization networks for radio frequency switches use metal oxide semiconductor varactors coupled in parallel with drains and sources of field-effect transistors that make up the radio frequency switches to reduce the generated harmonic distortions. Moreover, traditional radio frequency switches typically further include body bias resistor networks combined with dedicated varactor bias voltage sources. These body bias resistor networks result in radio frequency current losses while the radio frequency switches are in the on-state. As such, insertion losses are undesirably high. Moreover, the body bias resistor networks typically consume from 15% to 20% of a total die real estate, which is prohibitively wasteful for some applications.

The present disclosure provides a radio frequency switch made up of a series stack of a plurality of switch cells having off-state linearization networks that do not require a body bias resistor network because the off-state linearization network also provides body bias. Not including a body bias resistor network provides a lower radio frequency insertion loss with lower total die real estate footprint.

FIG. 1 is a schematic of a first embodiment of a switch cell 10 of the radio frequency (RF) type having a main field-effect transistor (FET) 12 and an off-state linearization network 14 in accordance with the present disclosure. The main FET 12 has a main drain terminal 16, a main source terminal 18, a main gate terminal 20, and a main body terminal 22. A first port P1 is coupled to the main drain terminal 16, and a second port P2 is coupled to the main source terminal 18. Radio frequency signals applied to the first port P1 are blocked from passing to the second port P2 when the main FET 12 is in an off-state. In contrast, the radio signals are passed from the port P1 to the second port P2 when the main FET transistor is 12 in an on-state. A gate control input GC1 coupled to the main gate terminal 20 receives a gate control signal that switches the main FET 12 between the off-state and the on-state. The main body terminal 22 may be made available to external body bias circuitry by way of a body control input BC1 that may couple to the main body terminal 22. However, external body bias circuitry is made unnecessary by the off-state linearization network 14 that also serves to bias the body of the main FET 12.

The off-state linearization network 14 is made up of a first body bias FET 24 having a first drain terminal 26 coupled to the main gate terminal 20, a first gate terminal 28 coupled to the main drain terminal 16, a first body terminal 30 coupled to the main body terminal 22, and a first source terminal 32. The off-state linearization network 14 further includes a second body bias FET 34 having a second drain terminal 36 coupled to the main gate terminal 20, a second gate terminal 38 coupled to the main source terminal 18, a second body terminal 40 coupled to the main body terminal 22, and a second source terminal 42 coupled to the first source terminal 32.

Figure 2:
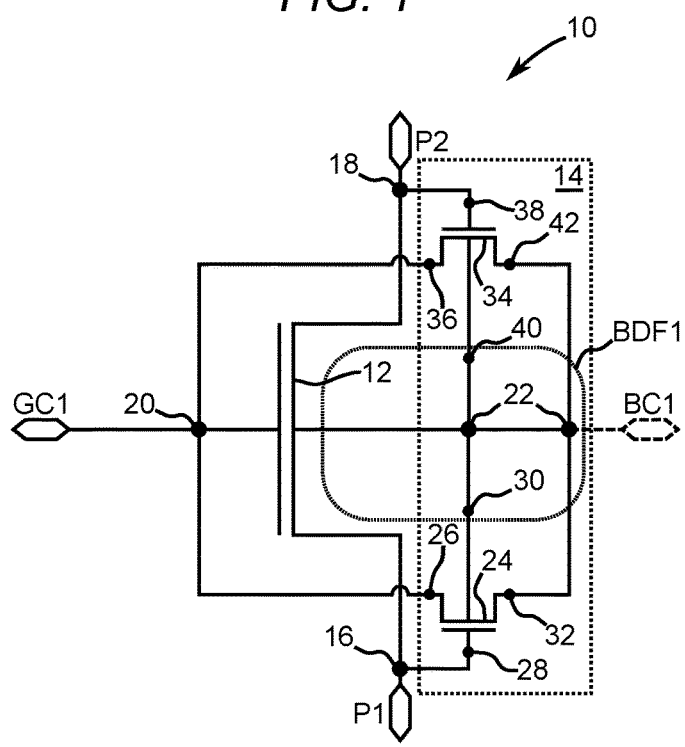
FIG. 2 is a schematic of the radio frequency switch cell having a second embodiment of the off-state linearization network in accordance with the present disclosure.

FIG. 2 is a schematic of the switch cell 10 having a second embodiment of the off-state linearization network 14 in accordance with the present disclosure. In this second embodiment, the first source terminal 32 and the second source terminal 42 are coupled to the main body terminal 22 so that the sources of the first body bias FET 24 and the second body bias FET 34 are not left floating. In at least one embodiment, the first body bias FET 24 and the second body bias FET 34 are n-type FET devices that share a body diffusion BDF1 with the main FET 12. In this exemplary embodiment, the main FET 12, the first body bias FET 24, and the second body bias FET 34 are inversion-type FET devices. In at least one embodiment, the first body bias FET 24 and the second body bias FET 34 do not share a body diffusion with the main FET 12. While a plurality of the switch cells 10 is envisioned to be coupled together to form an RF switch of the stacked type, the switch cell 10 may also be used as a stand-alone RF switch.

In both exemplary embodiments of the switch cell 10 depicted in FIG. 1 and in FIG. 2, the main FET 12 is at least 1000 times larger compared with the first body bias FET 24 and the second body bias FET 34. In some embodiments, the main FET 12 is from 1000 times larger to 3000 times larger compared with the first body bias FET 24 and the second body bias FET 34. On other embodiments, the main FET 12 is from 3000 times larger to 6000 times larger compared with the first body bias FET 24 and the second body bias FET 34. For example, in some embodiments, the channel length of the main FET 12 is from 1 mm to 6 mm, while the channel length for either of the first body bias FET 24 and the second body bias FET 34 is on the order of 1 μm.

Figure 3:
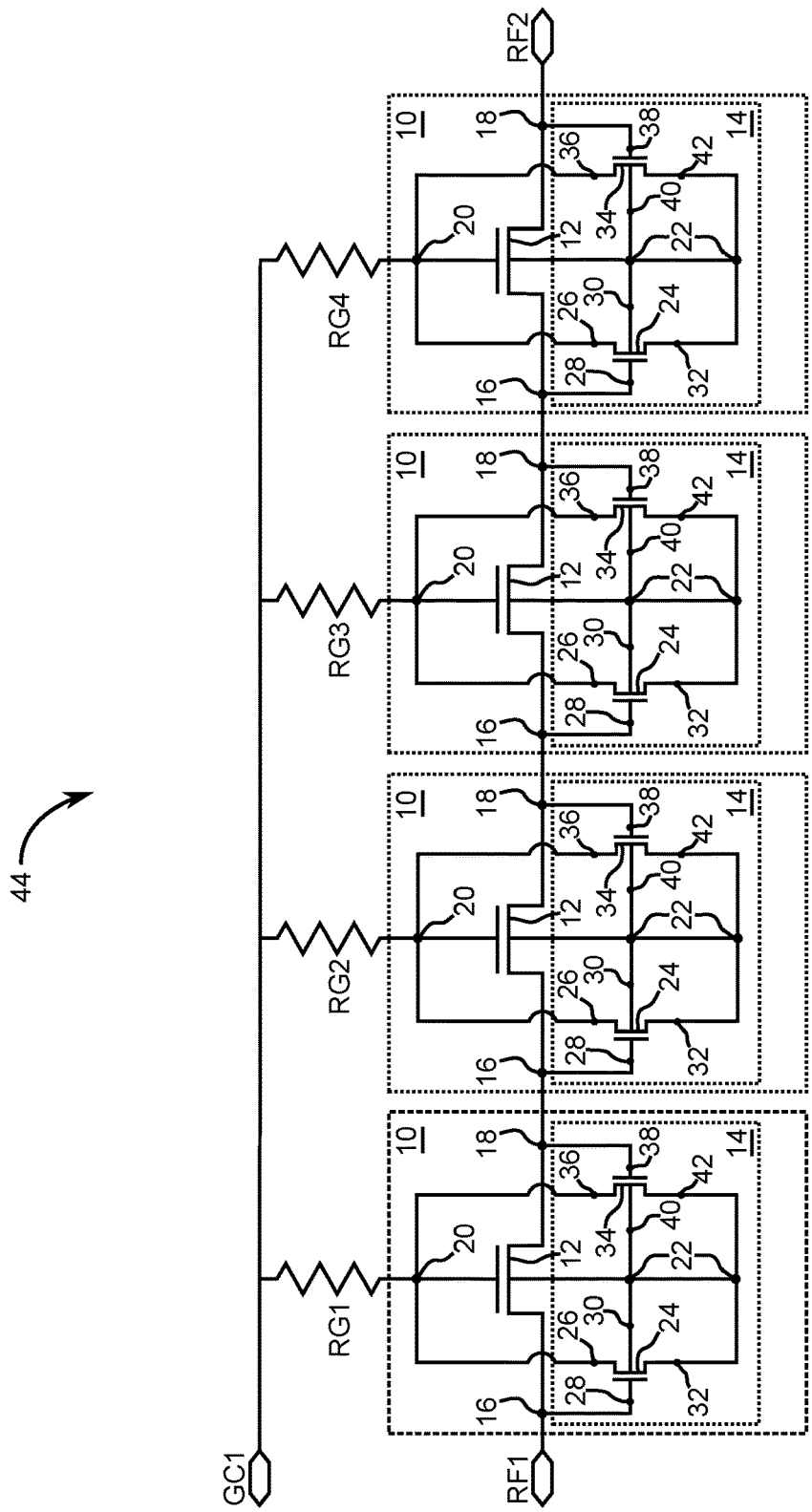
FIG. 3 is a schematic of a radio frequency switch made up of a plurality of the radio frequency switch cells of the present disclosure.

FIG. 3 is a schematic of an RF switch 44 of the stacked type made up of a plurality of switch cells 10 coupled in series. In this exemplary embodiment, each of the plurality of switch cells 10 is coupled together between a first node RF1 and a second node RF2. For example, a first one of the plurality of switch cells 10 coupled in series has its main drain terminal 16 coupled to the first node RF1, while a last one of the plurality of switch cells 10 has its main source terminal 18 coupled to the second node RF2. Intervening ones of the plurality of switch cells 10 are coupled in series from each corresponding main drain terminal 16 to each corresponding main source terminal 18 between the first one of the plurality of switch cells 10 and the last one of the plurality of switch cells 10.

In the exemplary embodiment of FIG. 3, gate resistors RG1, RG2, RG3, and RG4, one for each of the plurality of switch cells 10, are coupled between the gate control input GC1 and the main gate terminal 20 of each of the plurality of switch cells 10. The gate resistors RG1-RG4 have resistance values selected to prevent ringing when the main FET 12 of each of the plurality of switch cells is switched from the off-state to the on-state. For example, in some embodiments the gate resistors RG1-RG4 are well-type resistors that have a resistance value of 1 kilohm ±10%.

While FIG. 3 depicts four of the switch cells 10 coupled between the first node RF1 and the second node RF2, it is to be understood that an additional finite number of the switch cells 10 may be coupled in series between the first node RF1 and the second node RF2. For example, in some embodiments the number of switch cells making up the RF switch 44 is more than four of the switch cells 10. In some embodiments, at least 10 to 20 of the switch cells 10 are coupled in series to make up the RF switch 44.

In operation, with the RF switch 44 in the off-state to block an RF signal from passing between the first node RF1 and the second node RF2, the first body bias FET 24 and the second body bias FET 34 of each of the switch cells 10 are automatically switched to the on-state by the blocked RF signal. While in the on-state, the first body bias FET 24 and the second body bias FET 34 of each of the switch cells 10 contributes additional capacitances between drain-to-body and source-to-body of the main FET 12 of each of the switch cells 10. The additional capacitances contributed by the first body bias FET 24 and the second body bias FET 34 provide a linear compensation of an inherent nonlinear capacitance of the main FET 12. In contrast, when the RF switch 44 is in the on-state, the first body bias FET 24 and the second body bias FET 34 of each of the switch cells 10 are automatically switched to the off-state, which leaves the body of the main FET 12 of each of the switch cells 10 floating, leading to slightly improved on-state total switch resistance between the first node RF1 and the second node RF2.

Figure 4:
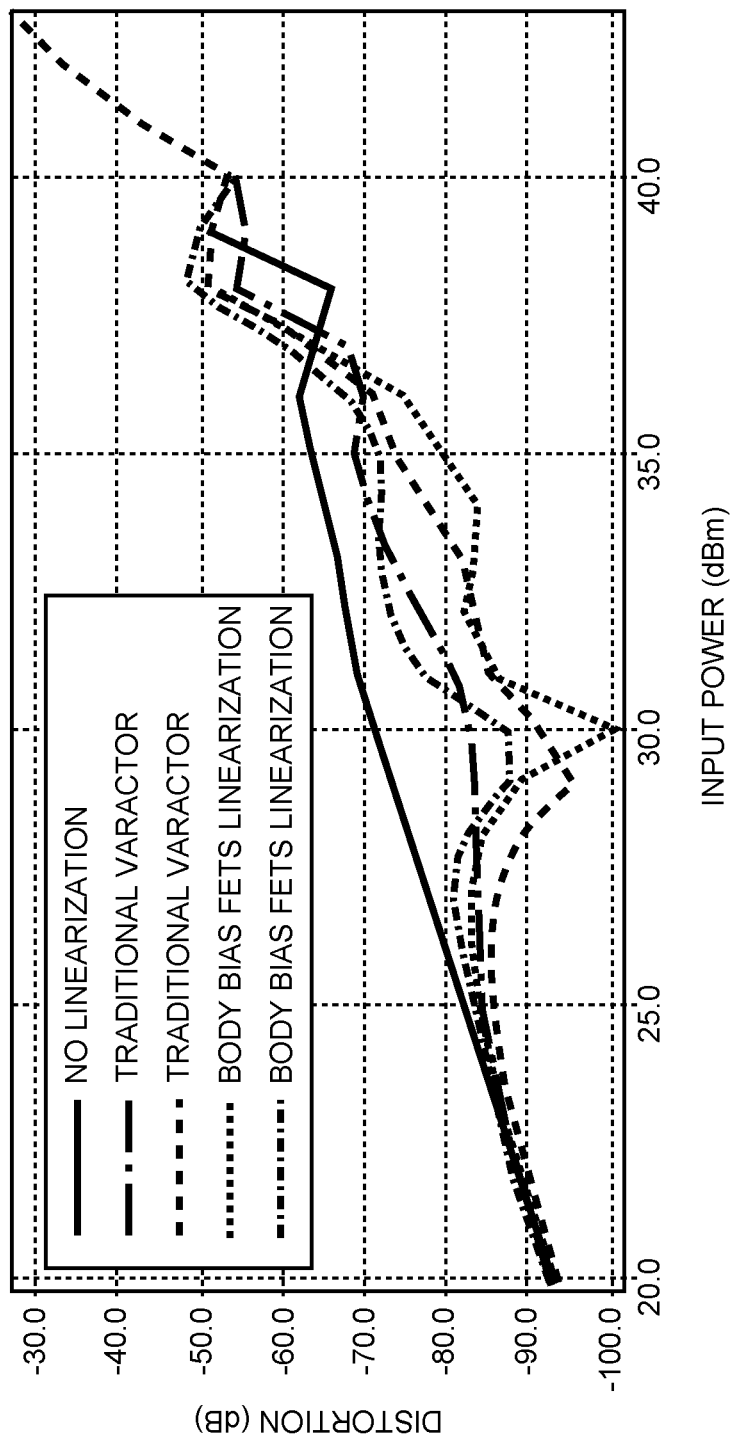
FIG. 4 is a graph of distortion versus input power for the radio frequency switch of the present disclosure in comparison with tradition varactor-based off-state linearization.

FIG. 4 is a graph of distortion versus input power for the RF switch 44 in comparison with tradition varactor-based off-state linearization and no linearization. The graph depicts a couple of simulation runs for a traditional varactor-based linearization network and a couple of simulation runs for the RF switch 44 having the body bias FETs that provide varactor-like linearization of each of the main FETs 12 (FIGS. 1-3). Notice that there are notches near 10 dBm of input power created by both the traditional varactor-based off-state linearization and the varactor-like linearization behavior of the off-state linearization network 14 (FIGS. 1-3). Notice also that in this exemplary case the off-state linearization network 14 has on average slightly better performance than the traditional varactor-based linearization network.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency switch comprising a first node, a second node, and a plurality of switch cells that are coupled in series between the first node and the second node wherein each of the plurality of switch cells comprises:

a main field-effect transistor (FET) comprising a main drain terminal, a main source terminal, a main gate terminal, and a main body terminal; and an off-state linearization network comprising:
 a first body bias FET having a first drain terminal coupled to the main gate terminal, a first gate terminal coupled to the main drain terminal, a first body terminal coupled to the main body terminal, and a first source terminal; and
 a second body bias FET having a second drain terminal coupled to the main gate terminal, a second body terminal coupled to the main body terminal, and a second source terminal coupled to the first source terminal.

2. The radio frequency switch of claim 1 wherein the main body terminal is coupled to the first source terminal and the second source terminal.

3. The radio frequency switch of claim 1 wherein the first body bias FET and the second body bias FET are n-type FET devices.

4. The radio frequency switch of claim 1 wherein the first body bias FET and the second body bias FET share a body diffusion with the main FET.

5. The radio frequency switch of claim 1 wherein the first body bias FET and the second body bias FET have body diffusions that are separate from a body diffusion of the main FET.

6. The radio frequency switch of claim 1 wherein the main FET is at least 1000 times larger than either of the first body bias FET or the second body bias FET.

7. The radio frequency switch of claim 1 wherein the main FET is from 1000 times larger to 3000 times larger than either of the first body bias FET or the second body bias FET.

8. The radio frequency switch of claim 1 wherein the main FET is from 3000 times larger to 6000 times larger than either of the first body bias FET or the second body bias FET.

9. The radio frequency switch of claim 1 wherein the main FET, the first body bias FET, and the second body bias FET are inversion-type FET devices.

10. The radio frequency switch of claim 1 further including gate resistors, one for each of the plurality of switch cells, wherein the gate resistors are coupled between a gate control terminal common to the plurality of switch cells and the main gate terminal of each of the plurality of switch cells.

11. A radio frequency switch cell comprising:

a main field-effect transistor (FET) comprising a main drain terminal, a main source terminal, a main gate terminal, and a main body terminal; and an off-state linearization network comprising:
 a first body bias FET having a first drain terminal coupled to the main gate terminal, a first gate terminal coupled to the main drain terminal, a first body terminal coupled to the main body terminal, and a first source terminal; and
 a second body bias FET having a second drain terminal coupled to the main gate terminal, a second body terminal coupled to the main body terminal, and a second source terminal coupled to the first source terminal.

12. The radio frequency switch cell of claim 11 wherein the main body terminal is coupled to the first source terminal and the second source terminal.

13. The radio frequency switch cell of claim 11 wherein the first body bias FET and the second body bias FET are n-type FET devices.

14. The radio frequency switch cell of claim 11 wherein the first body bias FET and the second body bias FET share a body diffusion with the main FET.

15. The radio frequency switch cell of claim 11 wherein the first body bias FET and the second body bias FET have body diffusions that are separate from a body diffusion of the main FET.

16. The radio frequency switch cell of claim 11 wherein the main FET is at least 1000 times larger than either of the first body bias FET or the second body bias FET.

17. The radio frequency switch cell of claim 11 wherein the main FET is from 1000 times larger to 3000 times larger than either of the first body bias FET or the second body bias FET.

18. The radio frequency switch cell of claim 11 wherein the main FET is from 3000 times larger to 6000 times larger than either of the first body bias FET or the second body bias FET.

19. The radio frequency switch cell of claim 11 wherein the main FET, the first body bias FET, and the second body bias FET are inversion-type FET devices.

20. The radio frequency switch cell of claim 11 further including a gate resistor coupled between a gate control terminal and the main gate terminal.

* * * * *